United States Patent
Mundon et al.

(10) Patent No.: US 10,393,089 B2
(45) Date of Patent: Aug. 27, 2019

(54) WAVE ENERGY CONVERTER

(71) Applicant: Oscilla Power, Inc., Seattle, WA (US)

(72) Inventors: Timothy R Mundon, Seattle, WA (US); Balakrishnan G Nair, Sandy, UT (US); Jennifer Vining, Seattle, WA (US)

(73) Assignee: Oscilla Power Inc., Seattle, WA (US)

( * ) Notice: Subject to any disclaimer, the term of this patent is extended or adjusted under 35 U.S.C. 154(b) by 163 days.

(21) Appl. No.: 15/217,772

(22) Filed: Jul. 22, 2016

(65) Prior Publication Data

US 2017/0009732 A1    Jan. 12, 2017

Related U.S. Application Data

(63) Continuation-in-part of application No. 14/855,135, filed on Sep. 15, 2015, and a continuation-in-part of application No. 14/808,436, filed on Jul. 24, 2015, now Pat. No. 9,656,728, and a continuation-in-part of application No. 14/181,574, filed on Feb. 14, 2014, now Pat. No. 9,438,138.

(60) Provisional application No. 62/195,693, filed on Jul. 22, 2015, provisional application No. 62/050,748, filed on Sep. 15, 2014, provisional application No. 62/028,582, filed on Jul. 24, 2014, provisional application No. 61/809,155, filed on Apr. 5, 2013.

(51) Int. Cl.
| | |
|---|---|
| *F03B 13/18* | (2006.01) |
| *H02K 35/00* | (2006.01) |
| *F15B 7/02* | (2006.01) |
| *H01L 41/12* | (2006.01) |
| *H02N 2/18* | (2006.01) |

(52) U.S. Cl.
CPC ............ *F03B 13/189* (2013.01); *F03B 13/18* (2013.01); *F03B 13/188* (2013.01); *F03B 13/1885* (2013.01); *F15B 7/02* (2013.01); *H01L 41/125* (2013.01); *H02K 35/00* (2013.01); *H02N 2/18* (2013.01); *Y02E 10/38* (2013.01)

(58) Field of Classification Search
CPC ...... F03B 13/189; F03B 13/18; F03B 13/188; F03B 13/1885
See application file for complete search history.

(56) References Cited

U.S. PATENT DOCUMENTS

| | | | |
|---|---|---|---|
| 8,826,658 | B2 | 9/2014 | Foster et al. |
| 8,904,778 | B2 | 12/2014 | Gerber et al. |

(Continued)

FOREIGN PATENT DOCUMENTS

WO    2002070337 A1    9/2002

OTHER PUBLICATIONS

Young "International Search Report" PCT/US16/43721, dated Nov. 29, 2016, 4 pages.

(Continued)

*Primary Examiner* — Viet P Nguyen
(74) *Attorney, Agent, or Firm* — Jeff Holman

(57) ABSTRACT

A wave energy converter includes a surface float including a non-axisymmetric profile, a reaction plate configured to be submerged below a water surface, and more than one flexible tether, each mechanically coupled to both the surface float and the reaction plate, the reaction plate having a moment of inertia in pitch and roll greater than a moment of inertia in pitch and roll of the surface float.

19 Claims, 9 Drawing Sheets

(56) References Cited

U.S. PATENT DOCUMENTS

| | | | |
|---|---|---|---|
| 2007/0257491 A1* | 11/2007 | Kornbluh | F03B 13/1845 |
| | | | 290/53 |
| 2007/0266704 A1 | 11/2007 | Bull et al. | |
| 2007/0286683 A1* | 12/2007 | Bull | B63B 35/4406 |
| | | | 405/195.1 |
| 2008/0131208 A1* | 6/2008 | Bull | B63B 35/4406 |
| | | | 405/195.1 |
| 2011/0012358 A1* | 1/2011 | Brewster | F03B 13/1885 |
| | | | 290/53 |
| 2011/0018275 A1 | 1/2011 | Sidenmark | |
| 2012/0047884 A1* | 3/2012 | McBride | F03G 6/00 |
| | | | 60/327 |
| 2013/0160444 A1* | 6/2013 | Foster | F03B 13/20 |
| | | | 60/497 |
| 2013/0341927 A1 | 12/2013 | Murphree | |
| 2014/0007568 A1* | 1/2014 | Crowley | F03B 11/004 |
| | | | 60/497 |
| 2014/0225371 A1 | 8/2014 | Nair et al. | |
| 2014/0265338 A1* | 9/2014 | Bretl | F03B 13/1845 |
| | | | 290/53 |
| 2016/0003214 A1* | 1/2016 | Mundon | F03B 13/22 |
| | | | 290/53 |
| 2016/0023721 A1* | 1/2016 | Mundon | B63B 22/20 |
| | | | 290/50 |
| 2017/0002789 A1* | 1/2017 | Nair | F03C 1/00 |
| 2019/0010915 A1* | 1/2019 | MacDonald | F03B 13/20 |

OTHER PUBLICATIONS

Young "Written Opinion of the International Searching Authority" PCT/US16/43721, dated Nov. 29, 2016, 7 pages.

\* cited by examiner

WAVE ENERGY CONVERTER

CROSS-REFERENCE TO RELATED APPLICATIONS

This application claims the benefit of U.S. Provisional Application No. 62/195,693, filed on Jul. 22, 2015, which is incorporated by reference herein in its entirety. This application also is a continuation-in-part of U.S. application Ser. No. 14/181,574, filed on Feb. 14, 2014, which claims the benefit of priority of U.S. Provisional Application No. 61/809,155, filed on Apr. 5, 2013. This application also is a continuation-in-part of U.S. application Ser. No. 14/808,436, filed on Jul. 24, 2015, which claims the benefit of priority of U.S. Provisional Application No. 62/028,582, filed on Jul. 24, 2014. This application also is a continuation-in-part of U.S. application Ser. No. 14/855,135, filed on Sep. 15, 2015 which claims the benefit of priority of U.S. Provisional Application No. 62/050,748, filed on Sep. 15, 2014. Each of these references is incorporated by reference herein in their entirety.

BACKGROUND

Various types of wave energy convertors have been used extensively for capturing mechanical energy from ocean waves and converting these to electrical energy. However, improvements in energy capture efficiency, reduced cost and higher reliability are still needed for commercial viability of wave energy convertors.

SUMMARY

Embodiments of a wave energy converter are described. In one embodiment, the wave energy converter includes a surface float including a non-axisymmetric profile, a reaction plate configured to be submerged below a water surface, and more than one flexible tether, each mechanically coupled to both the surface float and the reaction plate, the reaction plate having a moment of inertia in pitch and roll greater than a moment of inertia in pitch and roll of the surface float.

In an embodiment, the surface float is designed to move in heave, pitch and roll, but with different natural periods for at least two of these three motions, such that these natural periods will be distributed across the significant period range where the cumulative wave energy content for the deployment location. In an embodiment, the surface float has a load transfer unit for each tether to enable forces to be efficiently transmitted to the linear hydraulic gearbox, eliminating any off-axis loads.

In some embodiments, the reaction plate has a geometry that provides asymmetric hydrodynamic forces in the up and down directions. In an embodiment, at least one tether is mechanically coupled to at least one linear hydraulic gearbox.

In an embodiment, at least one linear hydraulic gearbox is mechanically coupled to at least one linear generator. In some embodiments, the linear hydraulic gearbox includes at least one piston that has a first area, and another piston that has a second area, where the first and second areas are not the same. In some embodiments, the linear hydraulic gearbox employs at least one set of tandem cylinders. In some embodiments, the linear hydraulic gearbox can amplify the displacement and speed of a translator in at least one linear generator relative to the displacement of the surface float relative to the reaction plate. In some embodiments, the surface float and reaction plate have geometries that allow these to be mated together during transportation.

Embodiments of a method for capturing and converting mechanical energy from ocean waves are described. In one embodiment, the method includes operating a wave energy convertor device that includes a surface float including a non-axisymmetric profile and a powertrain, a reaction plate configured to be submerged below a water surface, and more than one flexible tether, each mechanically coupled to both the surface float and the reaction plate, the reaction plate having a moment of inertia in pitch and roll greater than a moment of inertia in pitch and roll of the surface float. The method further includes facilitating motion of the surface float relative to the reaction plate, capturing at least some energy from waves, and transmitting the at least some energy to a powertrain in the surface float via at least one of the more than one flexible tether. Other embodiments of methods for capturing and converting mechanical energy from ocean waves are also described.

Other aspects and advantages of embodiments of the present invention will become apparent from the following detailed description, taken in conjunction with the accompanying drawings, illustrated by way of example of the principles of the invention.

BRIEF DESCRIPTION OF THE DRAWINGS

Throughout the description, similar reference numbers may be used to identify similar elements.

DETAILED DESCRIPTION

Figure 1:
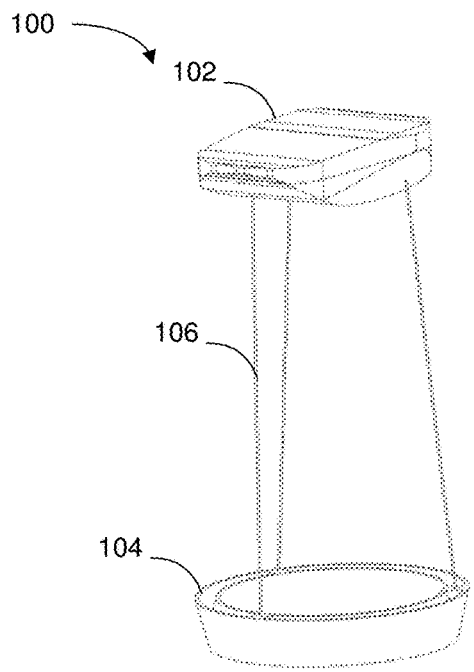
FIG. 1 depicts an embodiment of a wave energy converter including a surface float with a non-axisymmetric profile, a reaction plate, and flexible tethers.
Figure 2:
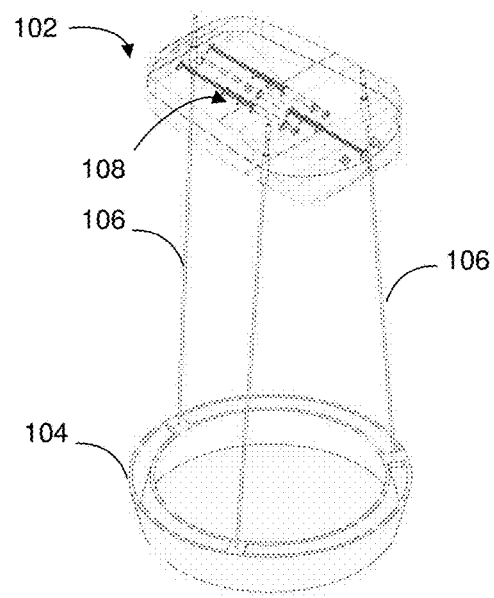
FIG. 2 depicts one embodiment of the wave energy converter of FIG. 1 with the surface float partially transparent to show internal components.

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment of the present invention. Thus, the phrases "in one embodiment," "in an embodiment," and similar language throughout this specification may, but do not necessarily, all refer to the same embodiment.

Heave plates (aka baffle plates or water entrapment plates) have been used extensively in the offshore space in order to damp the heave response of a body in a wave environment. The principle of operation is that the large plates, which are disposed such that their largest projected area is in a plane that is perpendicular to the heave direction, are attached below the surface of the water to limit (e.g., delay, dampen, decrease, etc.) motion in the heave direction. This increases the added mass of the system by adding a considerable drag force to the system at the location of the plate. In order for the plate to move in heave, the water around the plate must also be accelerated. The area and configuration of the plate are designed in order to optimize this increase in added mass. This increase lowers the natural frequency of the system, and essentially creates a high-pass filter that will respond to very low frequency waves (i.e., tidal waves), but not significantly to the regular ocean waves caused by wind. The heave plate is also generally disposed at a depth where the motion of the waves is much more attenuated than at the surface.

Embodiments of the invention described herein relate to an advanced wave energy converter 100 design (FIG. 1) that employs a number of innovative features/sub-systems, described below, that in some combinations will deliver a high Annual Climate Capture Width (ACCW) with low characteristic Capital Expenditure (CAPEX). These features/sub-systems are:

Some embodiments of this invention may employ a system design with multiple modes of energy capture. Some embodiments of the new wave energy converter 100 can be conceptualized as point absorbers with additional modes of motion allowing energy capture from waves in pitch and roll as well as heave. Some embodiments of the device may have a surface float 102 shaped to maximize or emphasize energy capture in the dominant wave direction, and designed to move in heave, pitch and roll, but with different natural periods for each of these motions. In some embodiments, the natural periods of at least two of these three motions will be distributed across the significant period range where the cumulative wave energy content for the target deployment location is concentrated, resulting in a highly efficient wide-band energy capture across the across the wave spectrum, and increasing the ACCW of the system. In some embodiments, the geometry of the surface float 102 is designed to maximize or influence roll and pitch response and operate as a good wave radiator and hence a good wave absorber. In some embodiments, the system is expected to have an ACCW of at least 5 m. Some embodiments may have ACCW's above 10 m, above 15 m, above 20 m, above 25 m, or above 30 m. Achievement of a specific ACCW or a specific range of ACCW in no way limits the scope of this invention. Some embodiments of this device may capture an annualized average power of at least 1 kW (i.e., total energy captured of 365 days×24 hours×1 kW=8,760 kWh). Some embodiments of this device may capture an annualized average power of at least 10 kW (i.e., total energy captured of 365 days×24 hours×10 kW=87,600 kWh). Some embodiments of this device may capture an annualized average power of at least 100 kW (i.e., total energy captured of 365 days×24 hours×100 kW=876,000 kWh). Some embodiments of this device may capture an annualized average power of at least 250 kW (i.e., total energy captured of 365 days×24 hours×250 kW=2,190,000 kWh). Some embodiments of this device may capture an annualized average power of at least 500 kW (i.e., total energy captured of 365 days×24 hours×500 kW=4,380,000 kWh).

In some embodiments, this invention may comprise a reaction plate 104, or a heave plate, mechanically coupled to the drivetrain on the surface float using non-rigid or flexible tethers 106. In some embodiments, the heave plate 104 may have at least one property or characteristic that is asymmetric in the vertical direction (i.e., the direction of gravitational force), and this property or characteristic may be, without limitation, drag force or added mass. In some embodiments, multiple modes of motion are enabled by the use of three or more flexible tethers 106 that connect the surface float 102 to the heave plate 104. In some embodiments, this enables the heave plate 104 to be located at sufficient depth to reduce or minimize wave forces applied to the heave plate 104, and provide substantial or maximum reaction force, without incurring prohibitive structural cost. In some embodiments, the heave plate 104 is designed to provide maximum or concentrated reaction forces in heave (mass, drag) as well as pitch/roll (high relative moment of inertia) the vertically asymmetric geometric profile enables slack/snap loads in the tethers 106 to be eliminated even under very high waves. In some embodiments, this enables low-cost deployment operations by mating with the surface float 102, allowing tow to site by non-specialist vessels. In some embodiments, this allows for a survival mode strategy by retracting the heave plate fully, mating with the surface float (see e.g., FIGS. 16 and 17) and essentially functioning as a one-body wave follower under extreme waves.

Some embodiments of this invention employ at least one highly tunable linear powertrain or drivetrain 108. In some embodiments, each tether 106 is connected directly to a linear drivetrain 108 located in the surface float 102. In some embodiments, this linear drivetrain 108 comprises at least one linear hydraulic gearbox and at least one linear generator, designed such that the velocity input to at least one linear generator is amplified by an amplification ratio relative to the motion of the surface float 102. In some embodiments, this amplification ratio can be adjusted remotely to match the current sea-state, so that the generators can operate at relatively high (e.g., 50% of maximum or higher, 75% of maximum or higher, or 90% of maximum or higher) or maximum efficiency and with high reliability. In some embodiments, as is well known for linear generators, a variety of strategies can be adopted to control damping to increase capture efficiency.

Some embodiments of this invention may be manufactured at a CAPEX low enough to enable usage and adoption for utility scale power generation. Such a low cost structure is possible due to: (1) low structural mass requirements due to the employment of flexible tethers 106; (2) small generator size/mass requirements due to displacement amplification; (3) no requirements to store and pump hydraulic fluid; embodiments of the system operate essentially as a hydrostatic system; (4) Hydraulic components that require little modification from catalog items from established vendors; (5) generators suitable for high volume manufacturing; (6) system mass being dominated by low cost materials such as steel (float) and concrete (heave plate); (7) design capable of tow-to-site deployment with non-specialized vessels.

Figure 8:
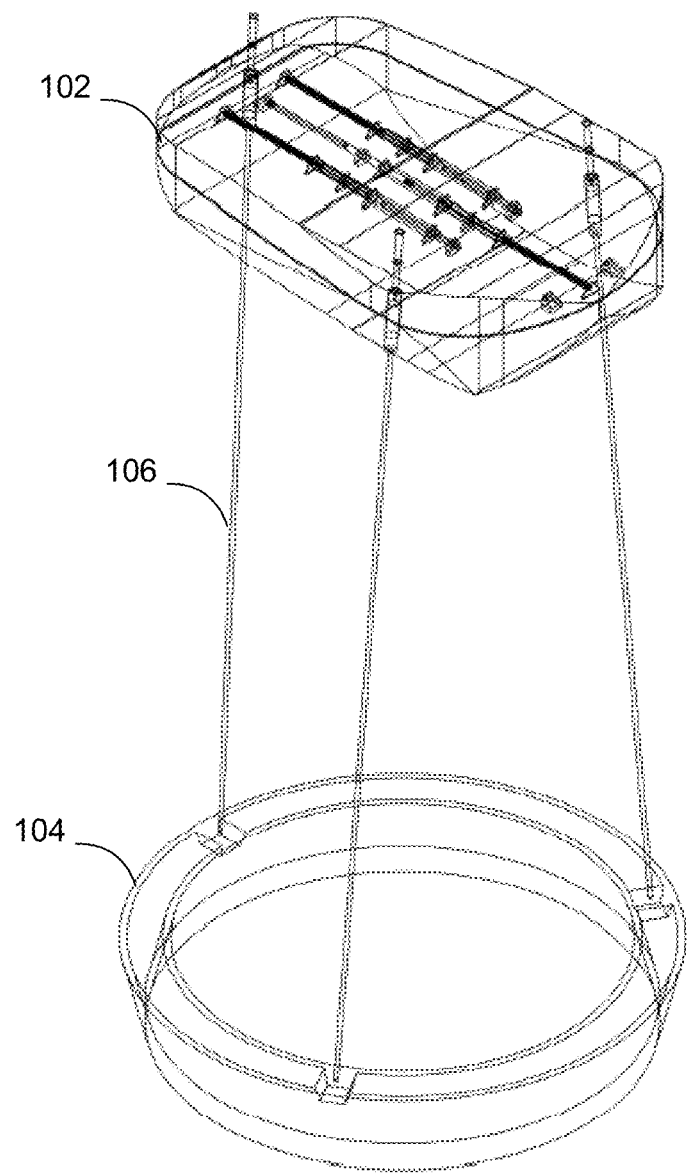
FIG. 8 depicts motions of the surface float.

Embodiments of the invention relate to a multi-mode point absorber that captures energy in pitch, heave and roll, (see e.g., FIG. 8) and to methods of using and operating such a device. Some embodiments may comprise a surface float 102 that has dynamic characteristics that adjust or maximize motions in heave, pitch and roll at different natural frequencies that are distributed in order to improve (compared with static characteristics) or maximize energy capture across a wider range. When the surface float 102 interacts with the incident waves, the wave forces on the surface float 102 react against the heave plate 104 (which does not experience forces directly from the waves due to the depth at which it is deployed). This creates significant tension changes in the tethers 106, which are mechanically coupled to the linear powertrain 108 on the float. The nature of the flexible tethers 106 means that surface float motions in heave, pitch and roll (see e.g., FIG. 8) will result in tension changes. These applied forces on the linear powertrain 108 are the effective mechanical energy captured by the surface float 102 and provided as input to the linear hydraulic gearbox. A basic analytical approach provides that for a rated wave with a 10 s period, typical force and displacement inputs would be just under 2,000 kN with 2 m of stroke for a captured mechanical power of about 1.3 MW (electrical power output of about 1 MW). In some embodiments, the linear hydraulic gearbox converts this mechanical energy into a higher displacement, lower force mechanical energy, which is directly applied to linear generators with minimal energy loss (>95% efficiency). In some embodiments, the displacement amplification ratio may range from 0.5 to 100. In some embodiments, the displacement amplification ratio may range from 1.5 to 20, and more specifically from 2 to 8. In the system configuration shown, the linear hydraulic gearbox has a displacement amplification ratio of 4, enabling an 8 m linear generator stroke to be achieved internal to the surface float (500 kN/8 m per linear powertrain). The linear generator is able to convert this mechanical energy into electrical energy with very high efficiency (>85% typical). Some embodiments may employ methods for tuning the generator damping by employing machine configurations that allow for advanced control topologies whereby force and/or VAR support can be controlled for relatively high or maximum conversion efficiency. In some embodiments, the power electronics sub-system further conditions the output and converts it to a smooth, high-voltage DC output at high efficiency (>97% expected) to be delivered it to the grid through a High Voltage subsea transmission lines.

Figure 3:
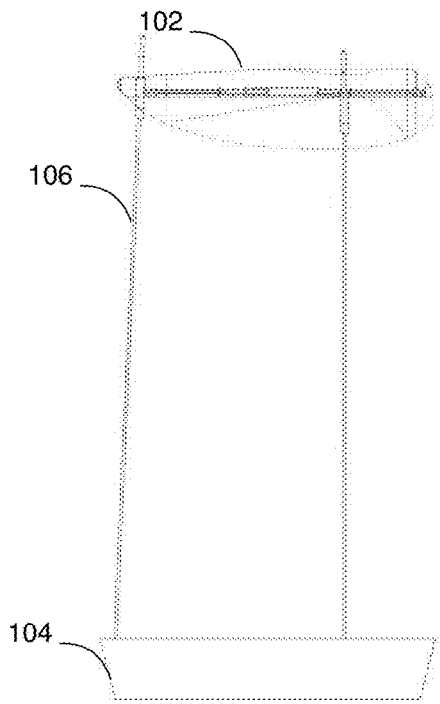
FIG. 3 depicts one embodiment of a side view of the wave energy converter of FIG. 1.
Figure 4:
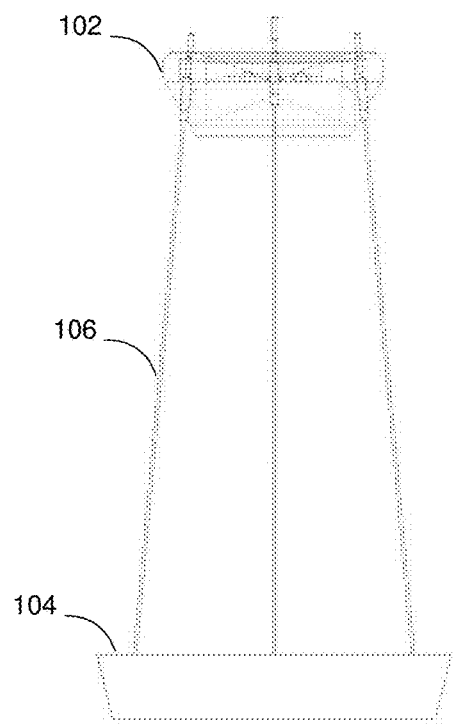
FIG. 4 depicts one embodiment of a rear view of the wave energy converter of FIG. 1.
Figure 5:
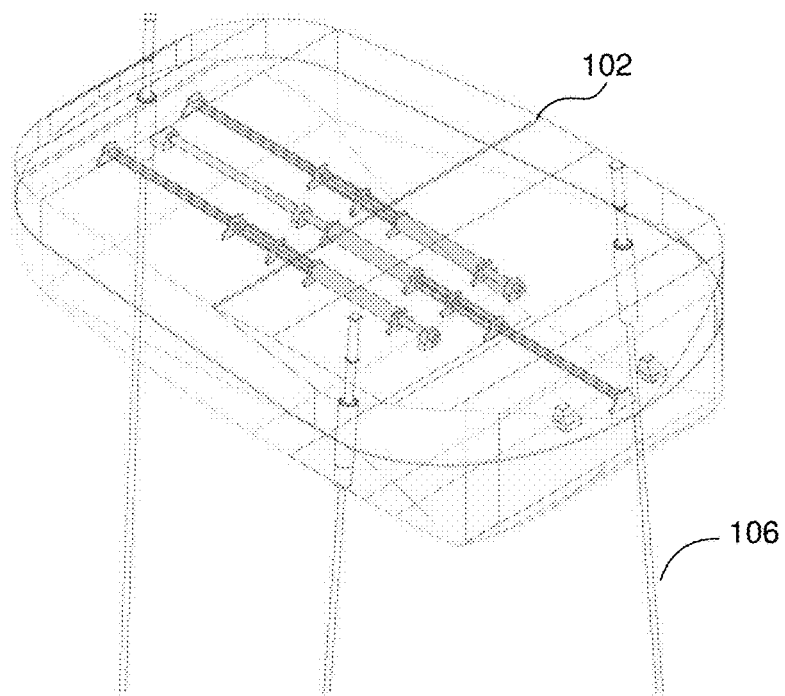
FIG. 5 depicts one embodiment of an isometric view of the surface float.
Figure 6:
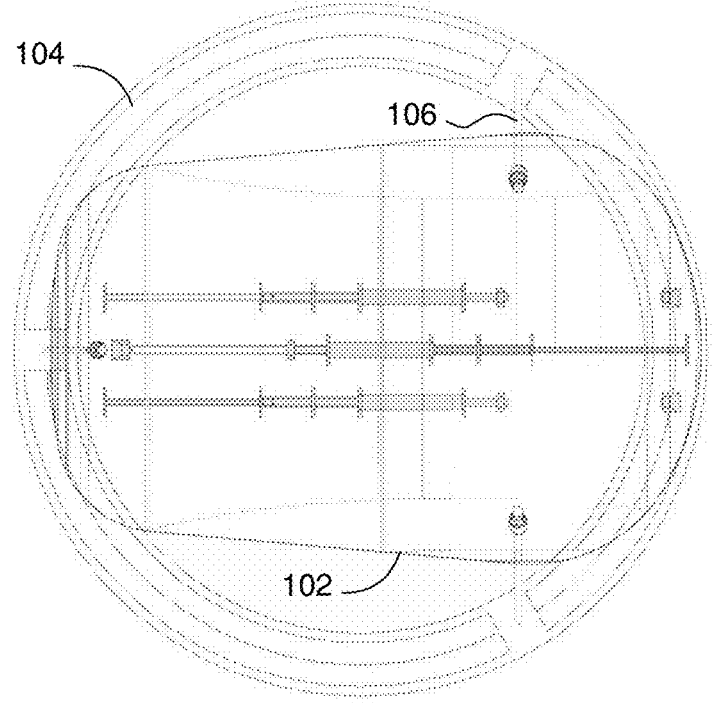
FIG. 6 depicts one embodiment of a top view of the wave energy converter of FIG. 1.

FIGS. 2-6 depict an embodiment of geometry of the surface float 102 in three orthogonal planes and one three-dimensional perspective. FIG. 4 shows one embodiment of the float in the water (shown to be still for the sake of clarity). The geometry of the surface float 102 is intended to make the system more conducive to pitch and roll. In some embodiments, the non-axisymmetric profile is designed to radiate waves predominantly in the direction of its key axis when pitching, with the expectation that this will result in higher efficiency wave capture due to a reduction in radiated waves perpendicular to the incident wave direction. In some embodiments, the mass properties of the surface float 102 may be designed to have a particular ratio relative to that of the heave plate 104. Tuning the ratio of moment of inertia (MoI) between these two structures is implemented for system resonance in a particular mode of motion. Additionally, the response in these rotational (and heave) modes may be tuned by adjusting the mass properties of the surface float through the addition of water ballast.

Some embodiments are directional and designed to optimize energy capture from a particular direction. Some embodiments may be designed to be non-directional and designed to orient themselves in the direction of the dominant wave. In the majority of cases, especially on the US west coast, wave directionality is confined to a small range of directions. Depending upon the incident wave direction, the device response will change, and maximum efficiency will occur when the incident wave direction coincides with the device primary axis (either in the +ve or −ve direction). The effect of off-axis waves will be only a small reduction in efficiency (e.g., less than 5%, less than 10%, or less than 25%) and will not have any impact upon the structural integrity of the device.

In some embodiments, the mooring connection will be made to the surface float with a standard three point mooring, with surface floats on the mooring lines providing horizontal compliance. In some embodiments, anchor points will be shared between devices to reduce the costs of anchor installation and infrastructure costs. The farm 700 will be laid out in a staggered grid with the grid normal to the primary or dominant wave direction. Specific characteristics will be determined on a project by project basis, however, in some embodiments, devices will be arranged to use common anchor points to reduce configuration costs. In such embodiments, the mooring configuration and water depth will determine the specific separation between devices.

As an example, for a 75 m water depth, a three point mooring and a 1:4 mooring scope (300 m radius mooring circle) would result in roughly a 500 m (450 m between rows×520 m separation between devices (FIG. 3.1). This configuration has devices sharing anchor points, reducing the cost of infrastructure. A shorter mooring scope allows for closer separation, although at the expense of higher vertical components of anchor loads (increased pull-out risk).

Figure 7:
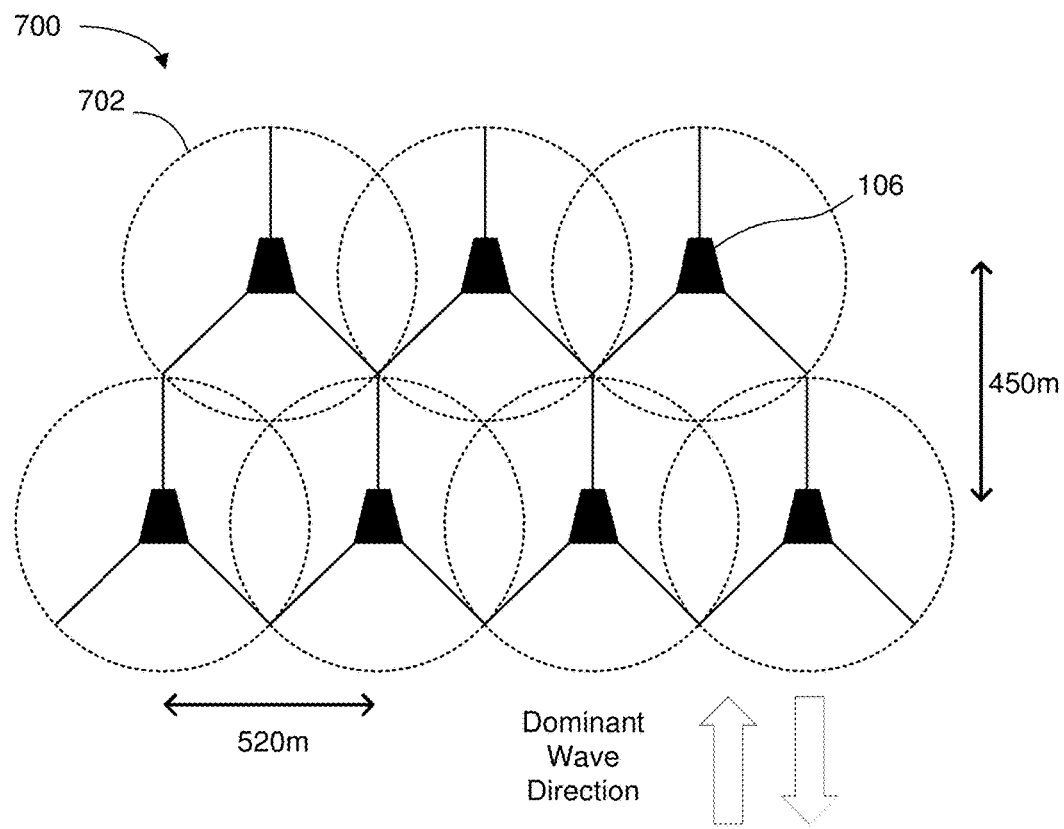
FIG. 7 depicts a schematic diagram of a farm or array of wave energy converters.

Referring to FIG. 7, device arrangements are depicted in array configuration. (Blue circles 702 show extents of the moorings for each device).

In some embodiments, each device would have its own subsea cable to shore. In some embodiments, individual devices would be connected into a common bus system with wet matable, dynamic cable connections to the sea floor.

In some embodiments, each wave energy converter will have a separate dynamic electrical cable to the sea floor. In some embodiments, electrical cables may include fiber for communications. In some embodiments, electrical cable buses will be aggregated in a substation that will be either a floating platform or a subsea unit.

In some embodiments, device separation would be adequate to allow access of moderate sized support vessels between device moorings. In some embodiments, the installation & recovery methodology of the system would allow a small vessel with onboard hydraulics to recover the heave plate for a single device and either perform a full range of maintenance operations, or disconnect the moorings and tow the device out of the farm 700 and to port for major overhaul.

In some embodiments, individual device operating parameters would be controlled at a farm level, with wave states being advised by wave measurement buoy(s) on the perimeter of the array. In some embodiments, wave state across the array will be used to advise generator damping and to advise entry of survival configuration.

The load and power flow paths for the primary power absorption step are: Surface Float→Tether→Linear Drivetrain.

In some embodiments, in order to facilitate energy capture from the waves, the elongated shape of the surface float 102 of the wave energy converter may be designed to have different natural periods in heave, pitch and roll. In some embodiments, the range of natural periods in two or more modes may span the significant period range where the cumulative wave energy content for the deployment location is concentrated (e.g. 6-12 s periods for the US West Coast), resulting in highly efficient wide-band energy capture across the wave spectrum, and increasing the ACCW. For some embodiments, the two-dimensional theoretical efficiency is 100% in regular waves as the float can move and capture energy in heave, pitch and roll (practical efficiency in three-dimensional irregular waves is much lower).

The heave period primarily depends upon the system mass, buoyancy and damping, but is also influenced by the damping characteristics of the powertrain. The roll and pitch periods are changed by altering their respective radii of gyration (k, which in turn may be increased by increasing the second moment of area for the particular motion and decreasing the total cross-sectional area) relative to that of the heave plate, about the relevant axis through the center of gravity and by decreasing the stability index (GM, is the spacing between metacenter and the center of gravity). Thus, in some embodiments, the roll and pitch periods can be adjusted by float design and mass distribution to change the radius of gyration for the particular motion and/or the metacenter, or by float weight distribution and ballasting to affect the center of gravity.

Materials that may be used, in some embodiments, include—Surface Float: Steel; Tethers: Synthetic ropes (Spectra, Polyester); Heave Plate: Steel reinforced concrete; load transfer unit (LTU): Steel and seawater lubricated bearing material (Delryn or similar). It is to be noted here that there are many alternative materials that may be used for each of the sub-systems noted above, and the choice of a particular material in no way limits the scope of this invention.

In some embodiments, the surface float may have a load transfer unit (LTU) (see e.g., FIG. 15) on each tether to enable forces to be efficiently transmitted to the linear hydraulic gearbox, eliminating any off-axis loads. Consequently, the LTU effectively acts as a linear bearing and is thus subject to horizontal and rotational loads. The hull will be subject to constant hydrostatic pressure, and a variety of intermittent forces due to wave slamming.

In some embodiments, end-stops are needed and will be integrated into the structure of the LTU. In some embodiments, motions in higher/extreme waves will be limited in other ways (e.g. effective use of the hydraulic return springs) so that the end-stops will rarely, and ideally, never be engaged.

In some embodiments, the properties/characteristics of the device may be tuned to control energy capture. In some embodiments, system natural periods are designed into the device as discussed above, although adjusting the system mass by adjusting the ballast and/or the linear drivetrain displacement will allow some degree of fine tuning.

Some embodiments of this invention may employ an asymmetric reaction-plate (or heave plate). In some embodiments, the heave plate is designed with a high moment of inertia relative to the surface float in both the pitch and roll directions, to provide relatively high or maximum reaction force. In addition, its geometry provides asymmetric hydrodynamic forces such as drag and added mass. In some embodiments, the asymmetric geometry may significantly reduce the likelihood of slack tether events occurring in extreme waves.

Secondary Internal Power Conversion

In some embodiments, a secondary power conversion step is a mechanical power-conditioning step with a linear hydraulic gearbox that has the following functions/characteristics:

(1) Power transfer to generator: In some embodiments, the primary hydraulic system operates in a nearly hydrostatic configuration with two pistons whose areas are designed such that there is an amplification of the displacement of one cylinder relative to the other at the cost of reduced force. This operation is somewhat analogous to that performed by a rotary gearbox, which converts input rotary energy at one RPM into a different (usually higher) RPM that is more suitable for optimal performance of a rotary generator. However, unlike a rotary hydraulic gearbox that is prone to wear, the simple, nearly hydrostatic operation of the hydraulic gearbox is similar to that used in a hydraulic press, in which a compressive force on one cylinder is transferred directly to another cylinder with a different piston area, resulting in an amplification ratio that is dependent upon the ratio of the piston areas. By using tandem cylinders and valves, this ratio can be adjusted during operation. Further, by introducing other valves and flow paths into the system, a number of innovative control schemes can be used. Since the operation is nearly hydrostatic, the power transfer efficiency is extremely high (>97% assumed). At the frequencies of interest (say for periods longer than 4 seconds) the hydraulic losses are minimal.

Figure 9:
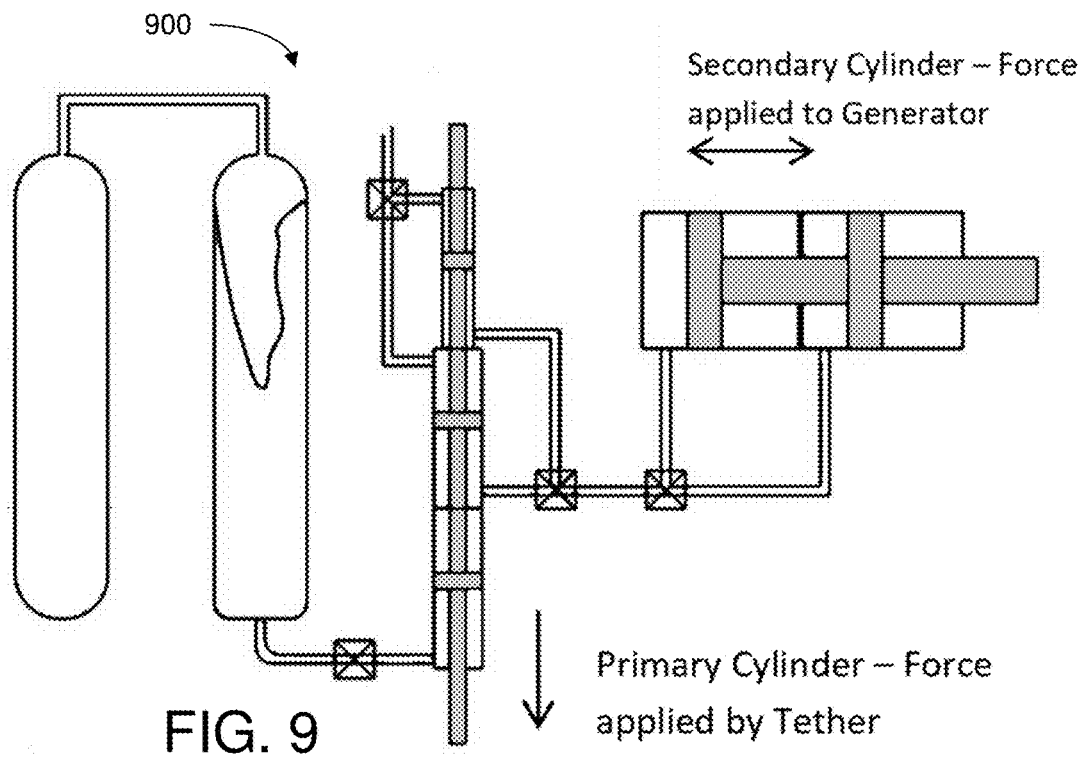
FIG. 9 depicts an embodiment of a simplified hydraulic arrangement that shows the use of tandem cylinders to change load amplification ratios.

(2) Maximize power capture efficiency and control system loads by controlling the displacement of the system: In some embodiments, the hydraulic system utilizes tandem cylinders and valves which can be controlled remotely to adjust system amplification ratios as shown in FIG. 9. Essentially, in low energy sea states including and up to the rated condition, the system will be tuned to operate at very high efficiency by increasing or maximizing PTO displacement. As input energy increases, this system displacement can be reduced to lower the effective system efficiency, limiting power capture and hence limiting system loads under high external wave forces.

(3) Store energy during the forward stroke: The displacement in the forward stroke, in addition to producing electric power is used to charge a secondary hydraulic accumulator (see e.g., FIG. 9) that provides force to act as a return spring. This hydrostatic spring drives return stroke of the translator in the opposite direction, converting the stored energy to additional electrical energy and returning the translator and pumping cylinders back to zero positions prior to the next stroke.

Typical materials that may be used include: Cylinders: High strength steel; Piston Rods: High strength steel; Working fluid: Hydraulic oil. It is to be noted here that there are many alternative materials that may be used for each of the sub-systems noted above, and the choice of a particular material in no way limits the scope of this invention.

The hydraulic system is similar to hydraulic presses that are designed to hundreds of millions of load cycles routinely in industrial applications. If one of the hydraulic systems experiences minor malfunctions, the effect on the system will be a de-rating and not loss of use.

Other embodiments of the invention may be envisioned where the force applied by the tethers may be utilized in different ways. For example, in some embodiments, the force applied by the tethers may be used to pump a fluid such as, without limitation, air, water or hydraulic fluid and increase the pressure and/or volume of the fluid stored and effectively store energy in the form of pressurized hydraulic fluid. This pressurized fluid can then be released as desired to drive a rotary or linear generator either in the device itself or external to the device (e.g. pumped to shore to drive an electric generator). For example, in some embodiments, the force applied by the tethers may be conditioned by some other mechanical means including, without limitation, levers or pulleys to increase either the force or displacement that is applied on an electric generator. For example, in some embodiments, the displacement may be amplified using a variety of means including, without limitation, levers or pulleys and used to drive a linear generator. In some other embodiments, the force using a variety of means including, without limitation, levers or pulleys and used to drive a variable reluctance generator, such as a magnetostrictive generator.

Some embodiments of this invention include any and all combinations of hydraulic and mechanical means to amplify either load or displacement so as to drive any type of electrical generator including, without limitation, linear generators, rotary generators, gas/fluid turbines or variable reluctance generators, including magnetostrictive generators.

Referring to FIG. 9, a simplified Hydraulic arrangement 900 is depicted that shows the use of tandem cylinders to be able to change the load amplification ratios. The cylinder selection shown indicates a reduction in displacement, and increase in force, but by changing the cylinder ratios with the same arrangement would apply equally to the described system whereby the displacement will be increased. Also note only the compressive side of the secondary hydraulic piping is shown for simplicity.

In some embodiments, each of the linear hydraulic gearboxes couples with a linear generator, designed to provide rated power at a displacement/speed higher than the wave induced motion of the surface float. The generator size and weight for delivering rated power can be substantially reduced due to the amplified speed of the translator. This creates a size reduction that allows the combined system to be comfortably located inside the surface float, reducing CAPEX, and allowing easier installation, limited limitations on manufacturing and lower O&M costs due to much easier access during maintenance operations.

Figure 10:
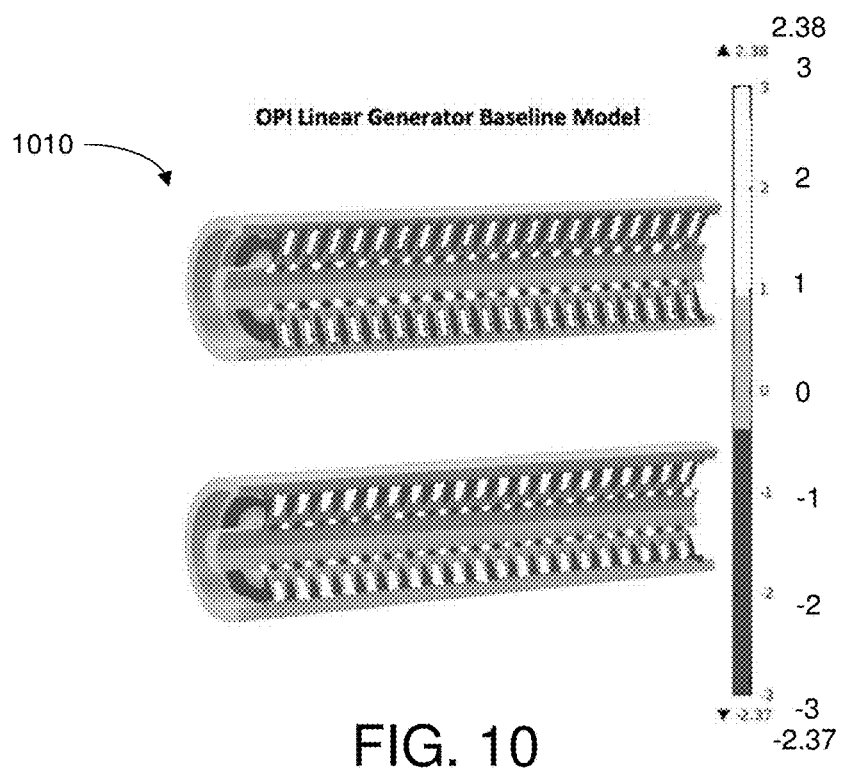
FIG. 10 depicts an embodiment of an array of magnets in a linear generator configured to move within a coil array.
Figure 11:
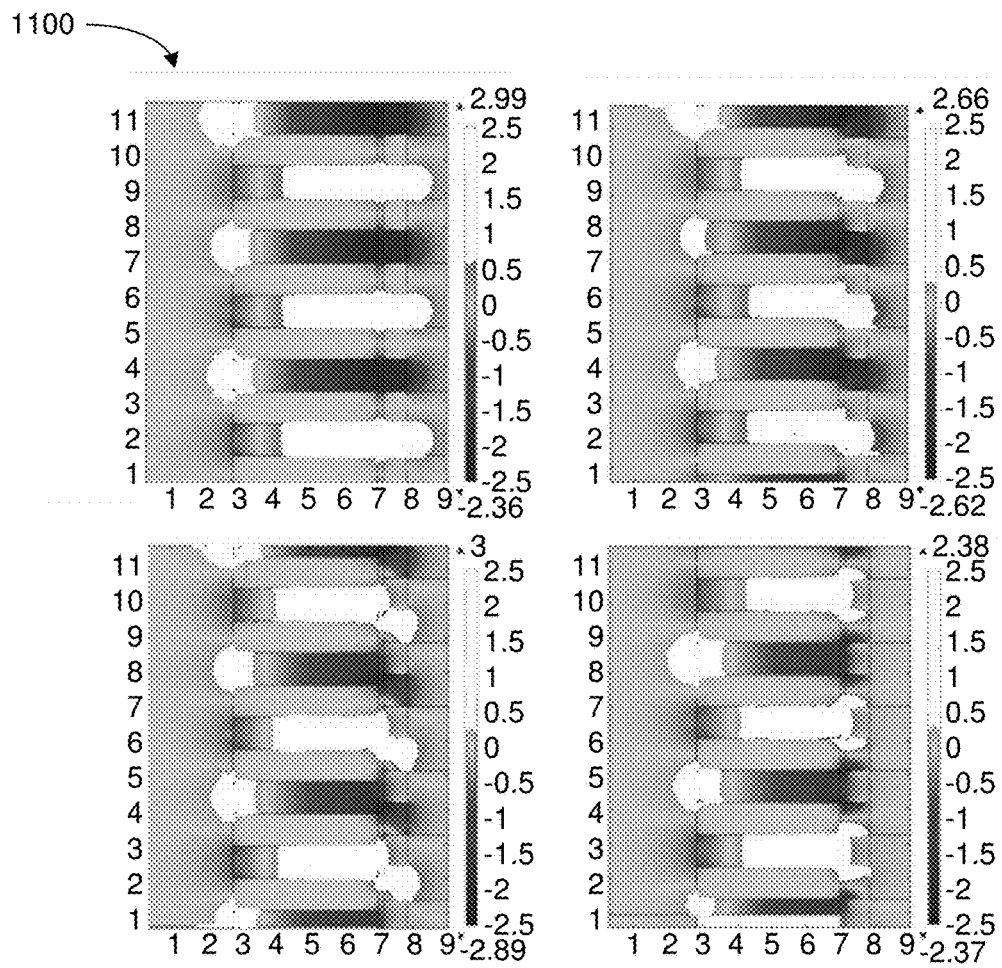
FIG. 11 depicts flux paths of adjacent magnets from a finite element simulation.
Figure 12:
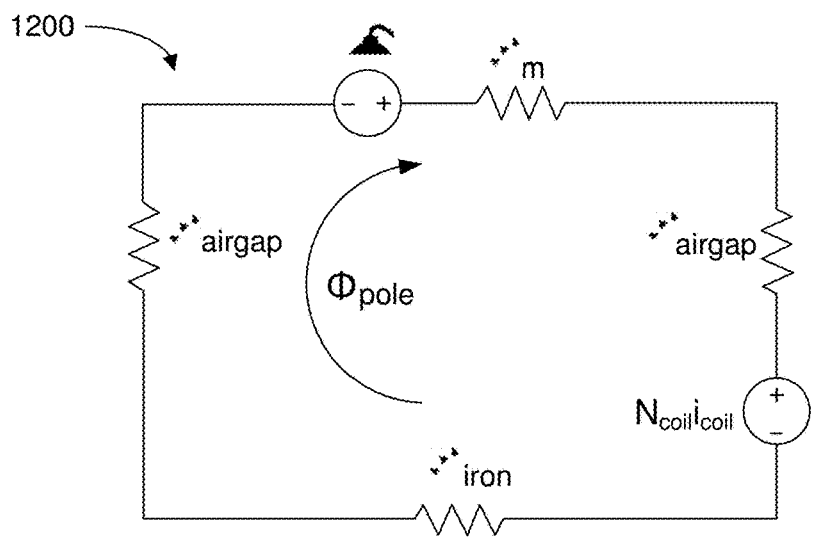
FIG. 12 depicts a schematic diagram of an embodiment of a magnetic circuit.

In some embodiments, the linear generator may consist of an array 1010 of magnets configured to move within a coil array as shown in FIG. 10. The disc-shaped magnets may be axially magnetized with a central bore, which allows mounting onto a core rod. The magnets may be oriented such that adjacent magnets have opposite magnetic polarizations. Opposing magnets may be separated using magnetically permeable (e.g. made of mild steel or electrical steel laminations)—spacers that have the same radial geometry and dimensions as the magnets themselves. The flux paths 1100 of adjacent magnets from a finite element simulation are shown in FIG. 11 and a schematic diagram 1200 of an equivalent magnetic circuit is shown in FIG. 12. The stators are designed with slots to house the copper coils, and the smallest inner diameter of the stator rings are configured such that they have a clearance with the magnets/spacers that defines a ring shaped air gap within the flux path. The flux from each magnet north pole is directed back to its own south pole through the spacer, the air gap and the stator. The non-magnetic core rod forms a weak competing flux path, and some leakage flux flows through the core rod. The flux coupling through the stators and spacers will be maximized when the magnets are located completely inside the coils, and will be zero when they are completely outside of the coils. Preliminary sizing estimates show a total of 14 metric tons of active mass per generator (this includes the main shaft of the translator).

Power Electronics and Control Strategy:

In some embodiments, a three-phase (or other multiphase) machine, such as this, allows for advanced control topologies whereby force and/or VAR support can be controlled to adjust or maximum conversion efficiency. A control strategy that varies the electrical load on a generator for precision impedance matching will be used. Machine efficiency is a function of control method, electromechanical conversion efficiency and mechanical efficiency. The overall efficiency of the electrical power conversion is estimated to be greater than 85%. A linear generator must accommodate significant forces on the shaft bearings due to the air gap flux. One embodiment is a design with bearings in the air gap that not only control and determine the size of the air gap, but provide support to the central shaft so that its diameter can be significantly smaller than is possible with support only at the edges. The load distribution on the bearing can also help to mitigate the impact of deflections/vibrational loads caused by cogging forces.

Figure 13:
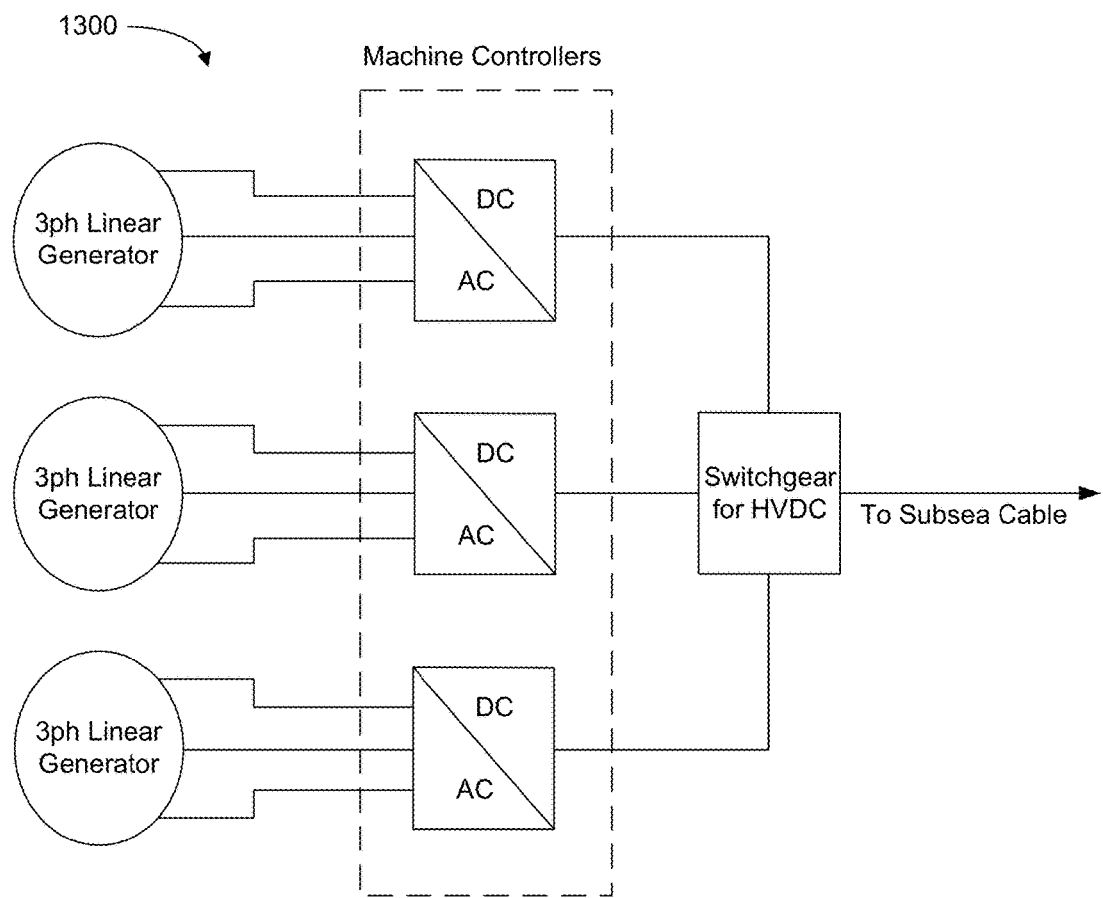
FIG. 13 depicts schematic diagram of an embodiment of an electrical layout.

In some embodiments, power shedding can be accommodated by the power electronics system by changing the generator damping to limit efficiency. Similarly, force limits can be imposed by controlling the reactive force through three-phase control. The generator has no intrinsic displacement limits, but will share end-stops with the linear hydraulic gearbox. Inherent redundancy comes from multiple generators and multiple windings on each generator in parallel circuits. Minor electrical failures will result in system de-rating and not down-time. The system will deliver power with voltage and power quality compliant with grid codes and similar to other renewable sources such as offshore wind. Referring to FIG. 13, a schematic diagram 1300 of an embodiment of an electrical layout is depicted.

Figure 14:
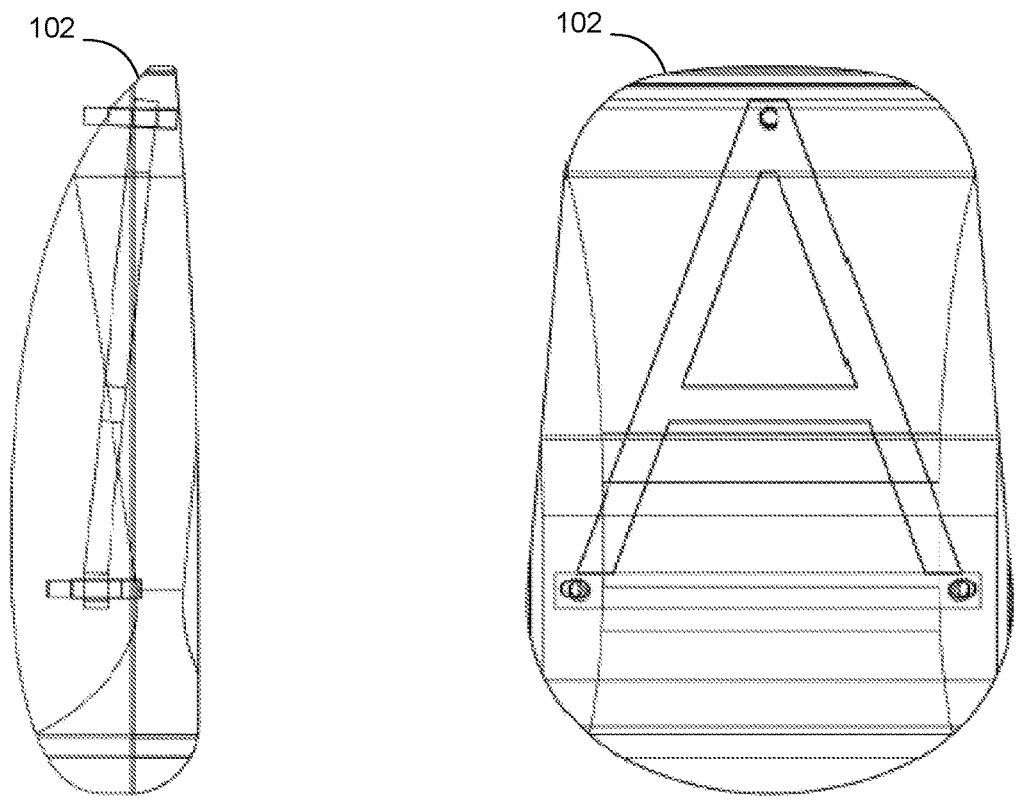
FIG. 14 depicts an embodiment of a structural layout and overall shape of a hull structure of a surface float with internal components.

In some embodiments, the surface float is primarily composed of a steel hull structure manufactured analogously to a typical barge or boat. It may include a steel superstructure with a plated steel hull around this to provide buoyancy. In some embodiments, the generators may be located longitudinally inside the hull on a mezzanine float. In some embodiments, the frame of the generators and hydraulics provides some longitudinal structural support to the float. In some embodiments, the hull structure will contain sealable ballast chambers so that desired mass properties can be obtained. An example of a specific structural layout and overall shape is shown in FIG. 14.

In some embodiments, the heave plate will be manufactured from steel reinforced marine grade concrete. The choice of a particular material for the heave plate, in no way limits the scope of this invention.

In some embodiments, this mass of the heave plate will be supported at three points around its circumference and so will be subject to bending loads. In some embodiments, pre-stressing the core steel frame can be done to improve the torsional and bending strength of the concrete structure. Tether interconnection points will be directly connected to the core steel reinforcement.

In some embodiments, tethers will be constructed from large diameter synthetic lines, typically ultra-high molecular weight polyethelene or polyester. The choice of a particular tether material, in no way limits the scope of this invention. In some embodiments, the ends of these lines will be connected with a stainless steel interconnection. The choice of a particular material or type for this interconnection in no way limits the scope of this invention.

Figure 15:
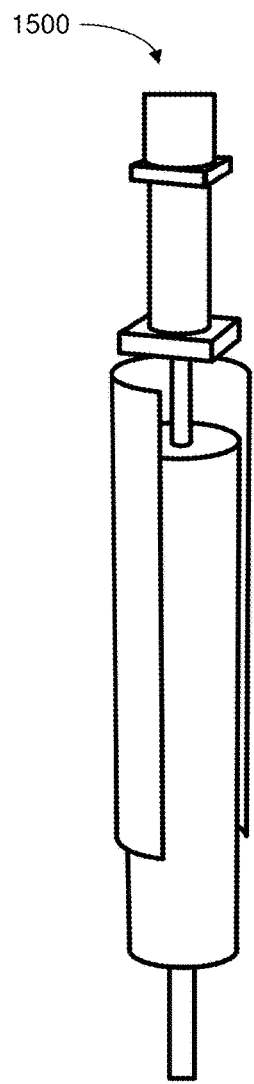
FIG. 15 depicts one embodiment of a load transfer unit.

FIG. 15 depicts an embodiment of a Load transfer unit 1500, shown in cutaway, with the primary hydraulic cylinder mounted at the one end and a simplified connection to the tether shown at the lower end.

In some embodiments, at the upper end of each tether, loads will be transferred to the surface float via load transfer units 1500 (LTU) (see e.g., FIG. 15) that serve to linearize the loads from the tether and eliminate off-axis loadings to the primary hydraulic cylinder on the linear hydraulic gearbox. In some embodiments, the LTU 1500 consists of a water lubricated tubular member that translates inside a steel tube that is structurally attached to the surface float core members. In some embodiments, the tubular translating member would have a steel core suitable for the tensions involved. In some embodiments, the core of the LTU 1500 would have a flange at one end that provides a mechanical limit to the motion (end-stop).

In some embodiments, the core load bearing structure of the surface float would be designed around these three tether connection points and would aim to distribute this load evenly across the lower hull surface. These points are the key high stress locations on the surface float and will need to be reinforced accordingly.

In some embodiments, the upper end of each load transfer unit core would be directly attached to the piston of the primary hydraulic cylinder, which acts as the input to the hydraulic load transfer system. In some embodiments, the cylinder flange would be structurally mounted to transfer load effectively to the surface float core structure. The secondary, output hydraulic cylinder would apply this load, conditioned by the hydraulic system, to the linear hydraulic generator, which would be mounted onto a mezzanine floor inside the hull structure of the surface float. The secondary cylinder and stator would form a combined unit, which would react against each other and not transfer these loads to the surface float hull structure.

Figure 16:
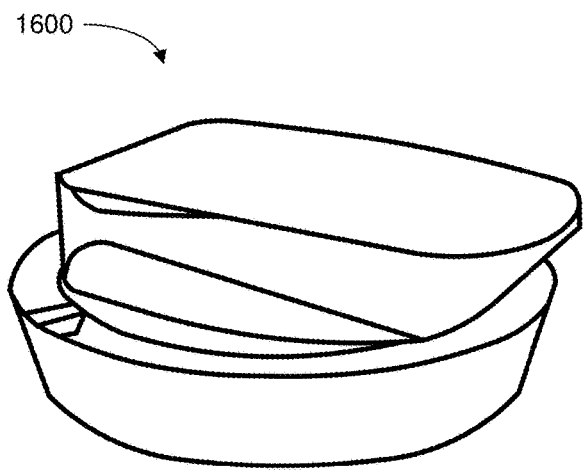
FIG. 16 depicts one embodiment of a heave plate retracted and mated with a surface float.
Figure 17:
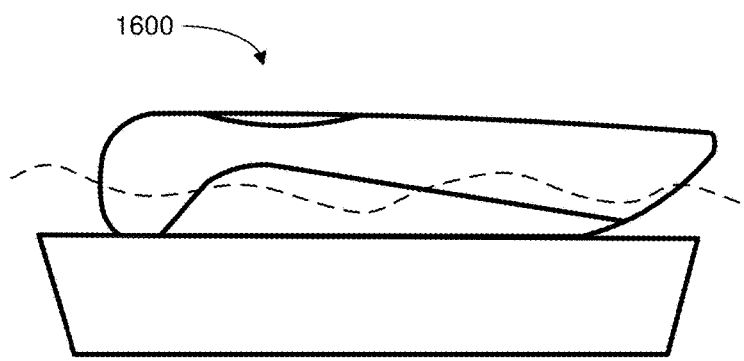
FIG. 17 depicts another embodiment of a heave plate retracted and mated with a surface float.

In some embodiments, in survival conditions, the heave plate will be retracted and mated with the surface float, forming a single body 1600 (see e.g., FIGS. 16 and 17). In such cases, structural loads will be significantly reduced and restricted to the hydrodynamic forces on the combined unit.

The flexible tethers in the system are an important element in regards to survival. The simplicity of the system is such that the critical survival case occurs when the wave environment can potentially cause a slack event in one tether. This risk is highest when the device response is maximized. In the case of a slack event, where the load in the tether reduces to zero, an unpredictably large snap load will follow. This is mitigated by the ability to employ different system configurations depending upon the extremity of the sea state.

Some embodiments comprise an asymmetric heave plate that modifies the system dynamics to increase the minimum tether load and hence reduces the probability of slack loads: When a heave plate with flexible tethers is employed, energy transfer is possible only when the float is moving up relative to the heave plate because of the need to maintain a positive tension in the tethers. As such, in some embodiments, it may be important that it returns to a mean position after each upward force is applied to the heave plate by the surface float. For a WEC that employs flexible tethers, the downward restoring force is provided by gravity alone and will be resisted by the hydrodynamic drag, inertia and damping of the heave plate. For a conventional (i.e., symmetrical and fixed) heave plate, these hydrodynamic parameters are optimized to provide maximum resistance. For a flexibly attached heave plate, however, this approach results in a significant reduction in the speed at which the heave plate can return to its mean position. If the resistance is too great, the heave plate may not return to its mean position before the next upward force acts on the tether, potentially resulting in the critical loading case discussed above. Embodiments of the asymmetric heave plate approach used herein provide both an appropriate reaction force and trivial or minimal resistance to the downward restoring motion.

Some embodiments of the system have a linear hydraulic gearbox that allows reconfiguration of the system stiffness and damping. Some embodiments of this invention are methods for selecting system parameters that are appropriate for the sea state. For smaller wave conditions, such methods can increase displacement to achieve high efficiency. In larger wave conditions, such methods allow the stiffness of the system to be increased to change the frequency response of the system to reduce the motions and structural loadings. As the sea states get larger and into the severe conditions that would result in critical slack events, some embodiments can employ a survival configuration. In these extreme sea states, the flexible tethers (or parallel lines) can be used to retract the heave plate so that it automatically mates with the surface float. In this configuration the device can now act like a single rigid body and becomes limited by the hydrodynamic forces on the single combined structure rather than the tether or reaction loads.

In some embodiments, the entry into different device configurations will be triggered by the measured wave conditions at the site. At an individual device level, this would be a combination of the waves measured by an adjacent wave measurement buoy and the recorded motions and structural loads on the device itself. A similar operating process will be used in array configurations, with the primary difference being that the information from multiple devices and measurement buoys can be used to provide more accurate information for decisions on how to control the array as a whole. This detailed information will be combined with wave forecasting to select the required system configuration.

Shipping/Transport Considerations:

In some embodiments, manufacturing is dockside with the system launched into in shallow water using conventional methods. Generators are modular and assembled remotely and shipped to site by standard road shipping. Structural steel is procured in bulk by the shipyard and typically transported via sea directly to the facility or by standard road shipping. Load-rated components may be assembled elsewhere and certified/proof tested before being shipped to the yard for integration into the hull. Hydraulics is shipped from vendor site directly to assembly dock by standard shipping. Power-electronics are shipped to assembly site from sub-system manufacturer first, prequalified at assembly site and shipped to dock for assembly. Winches for heave plate operations are shipped from vendor site directly to assembly dock by standard shipping.

System Integration:

Incorporation of the power-train components into the surface float are carried out by trained personnel dockside with assistance from local contractors for routine operations such as lifting and welding.

Surface Float/Heave Plate Dock-Side Mating Operation:

The heave plate is launched into shallow water and floated by means of external buoyancy (and through virtue of its 'V' profile). This is sunk onto a flat sandy seafloor at a depth of approximately 10 m. The surface float is then launched and floated directly over the heave plate. The tethers are connected to the heave plate by divers and then the winches on the surface float are used to tension these lines until the heave plate is lifted against the bottom of the surface float. There are features on the bottom of the float and top of the heave plate that enable alignment and mating of these two structures. At this stage the system is in the installation/survival configuration.

Mooring Installation:

The installation of the moorings is done with standard vessels. The moorings are, in some embodiments, to be standard drag embedment anchors where the seabed allows; otherwise gravity or piled anchors will be used. After installation, mooring lines are connected to locator floats at the planned location of the systems for easy retrieval during the system deployment, which may be a few days or even weeks later.

System Deployment:

For some embodiments, the deployment involves the mated system being towed to site using a standard tugboat with no specialized capability except the ability to carry a hydraulic compressor to power the deployment winches. After the system is towed to site, the mooring lines are disconnected from the locator buoys and connected by divers to the connection points on the surface float. The locking clamps holding the heave plate and surface float together are then released, and the surface float is lowered using the on-board self-deploying strategy powered by the hydraulic pump carried by the tug.

While the system described has inherently high reliability, the system architecture enables straightforward maintenance activities as needed. In addition to planned and critical maintenance actives that can be completed on site, the system has the ability for the heave plate to be recovered and mated to the surface float, whereby it can be disconnected from the moorings and towed to either a protected location or a port facility for work to be completed.

Planned maintenance can be completed on the device in-situ within reasonable weather windows. The size of the device would allow internal access for service personnel, allowing safety and protection from the elements during operations. Before any maintenance operation, the primary hydraulic driving cylinder circuit (connected to the LTU and directly loaded by the tether) can be locked, preventing any motion. This would then enable service operations to be completed on the drivetrain.

For more major service operations such as those that require the replacement of an item in the primary load path, such as the primary hydraulic cylinder, tether or load transfer unit, the heave plate can be raised slightly (or fully, depending upon operation) using the lifting lines that run parallel to the tethers. This would relieve the load on the tether and enable replacement of items in the load path.

The system may incorporate a structural health monitoring system that would monitor the condition of key components and advise of remaining lifetime and current health. This would be used to schedule maintenance on a just-in-time basis, ensuring minimum risk and minimum OPEX costs. Types of on-board sensors/monitors include, but are not necessarily limited to, hydraulic pressure sensors, load cells, strain gauges, on-board CCD cameras with voice (for squeal detection), water level sensors, current sensors (corrosion protection system), oil quality sensors.

Planned maintenance Items that would be completed on set intervals are: Primary and secondary hydraulic cylinders; Other hydraulic components; Load Transfer Unit; Linear bearing units.

Components that are designed for a full lifetime, and would require only non-scheduled maintenance, triggered through problems detected in the health monitoring system are: Generator; Tether; Power Electronics; Hull Components.

Additionally, given that the device may be disconnected and towed to shore in the event of serious damage or component failure, the ability exists to address most circumstances.

In an array configuration, the service operations will remain the same. The self-deploying architecture allows for relatively small boats to perform all required maintenance activities. Furthermore, these smaller vessels will be able to pass between the moorings in an array, possibly towing a system. This enables a device to be removed from the array in case of major problems and potentially replace it with another, allowing substantial or maximum uptime for the array while the damaged device is repaired elsewhere.

In the above description, specific details of various embodiments are provided. However, some embodiments may be practiced with less than all of these specific details. In other instances, certain methods, procedures, components, structures, and/or functions are described in no more detail than to enable the various embodiments of the invention, for the sake of brevity and clarity.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

Although specific embodiments of the invention have been described and illustrated, the invention is not to be limited to the specific forms or arrangements of parts so described and illustrated. The scope of the invention is to be defined by the claims appended hereto and their equivalents.

Other embodiments may incorporate one or more other aspects from related descriptions, including the subject matter described and shown in:

U.S. Pat. No. 9,169,823, issued on Oct. 27, 2015, which claims the benefit of priority of U.S. Provisional Application No. 61/664,444, filed on Jun. 26, 2012

U.S. application Ser. No. 14/181,574, filed on Feb. 14, 2014, which claims the benefit of priority of U.S. Provisional Application No. 61/809,155, filed on Apr. 5, 2013

U.S. application Ser. No. 14/808,436, filed on Jul. 24, 2015, which claims the benefit of priority of U.S. Provisional Application No. 62/028,582, filed on Jul. 24, 2014

U.S. application Ser. No. 14/855,135, filed on Sep. 15, 2015 which claims the benefit of priority of U.S. Provisional Application No. 62/050,748, filed on Sep. 15, 2014

Each of these referenced patent applications is incorporated herein in its entirety.

What is claimed is:

1. A wave energy converter, comprising:
   a surface float comprising a non-axisymmetric profile;
   a reaction plate configured to be submerged below a water surface;
   wherein the reaction plate comprises an annular shaped structure comprising an increasing cross section from a bottom surface of the reaction plate to a top surface of the reaction plate;
   more than one flexible tether, each mechanically coupled to both the surface float and the reaction plate; and
   the reaction plate comprising a moment of inertia in pitch greater than a moment of inertia in pitch of the surface float and a moment of inertia in roll greater than a moment of inertia in roll of the surface float.

2. The wave energy convertor of claim 1, wherein the surface float is configured to move in three motions comprising heave, pitch, and roll, and wherein two of the three motions have different natural periods, such that these natural periods will be distributed across the significant period range where the cumulative wave energy content for the deployment location.

3. The wave energy convertor of claim 1, wherein the surface float comprises a load transfer unit attached to the surface float for at least one flexible tether to enable forces to be efficiently transmitted to a linear hydraulic gearbox.

4. The wave energy convertor of claim 1, wherein the reaction plate comprises a geometry configured to provide asymmetric hydrodynamic forces in an up direction and a down direction.

5. The wave energy convertor of claim 1, wherein at least one tether is mechanically coupled to at least one linear hydraulic gearbox.

6. The wave energy convertor of claim 5, wherein the at least one linear hydraulic gearbox is mechanically coupled to at least one linear generator.

7. The wave energy convertor of claim 5, wherein the at least one linear hydraulic gearbox comprises at least one piston that has a first area, and another piston that has a second area, wherein the first and second areas are not the same.

8. The wave energy convertor of claim 5, wherein the linear hydraulic gearbox employs at least one set of tandem cylinders.

9. The wave energy convertor of claim 1, wherein the surface float and the reaction plate comprise geometries that allow the surface float and the reaction plate to be mated together during transportation.

10. A method for capturing and converting mechanical energy from ocean waves comprising:
    operating a wave energy convertor device that comprises:
    a surface float comprising a non-axisymmetric profile and a powertrain;
    a reaction plate configured to be submerged below a water surface;
    wherein the reaction plate comprises an annular shaped structure comprising an increasing cross section from a bottom surface of the reaction plate to a top surface of the reaction plate;
    more than one flexible tether, each mechanically coupled to both the surface float and the reaction plate, the reaction plate comprising a moment of inertia in pitch greater than a moment of inertia in pitch of the surface float and a moment of inertia in roll greater than a moment of inertia in roll of the surface float;
    facilitating motion of the surface float relative to the reaction plate; and
    capturing at least some energy from waves and transmitting the at least some energy to a powertrain in the surface float via at least one of the more than one flexible tether.

11. The method of claim 10, wherein the surface float is configured to move in three motions comprising heave, pitch, and roll, and wherein two of the three motions have different natural periods, such that these natural periods will be distributed across the significant period range where the cumulative wave energy content for the deployment location.

12. The method of claim 10, wherein the surface float comprises a load transfer unit for each flexible tether to enable forces to be efficiently transmitted to a linear hydraulic gearbox, eliminating any off-axis loads.

13. The method of claim 10, wherein the reaction plate comprises a geometry configured to provide asymmetric hydrodynamic forces in an up direction and a down direction.

14. The method of claim 10, wherein at least one tether is mechanically coupled to at least one linear hydraulic gearbox.

15. The method of claim 14, wherein the at least one linear hydraulic gearbox is mechanically coupled to at least one linear generator.

16. The method of claim 14, wherein the at least one linear hydraulic gearbox comprises at least one piston that has a first area, and another piston that has a second area, wherein the first and second areas are not the same.

17. The method of claim 14, wherein the linear hydraulic gearbox employs at least one set of tandem cylinders.

18. The method of claim 14, wherein the linear hydraulic gearbox is configured to amplify a displacement and speed of a translator in at least one linear generator relative to a displacement of the surface float relative to the reaction plate.

19. The method of claim 10, wherein the surface float and the reaction plate comprise geometries that allow the surface float and the reaction plate to be mated together during transportation.

* * * * *